(12) United States Patent
Chung et al.

(10) Patent No.: US 11,700,751 B2
(45) Date of Patent: *Jul. 11, 2023

(54) DISPLAY DEVICE

(71) Applicants: SAMSUNG ELECTRONICS CO., LTD., Suwon-si (KR); SAMSUNG DISPLAY CO., LTD., Yongin-si (KR); SAMSUNG SDI CO., LTD., Yongin-si (KR)

(72) Inventors: Deukseok Chung, Yongin-si (KR); Sung Hun Lee, Hwaseong-si (KR); Tae Gon Kim, Hwaseong-si (KR); Shin Ae Jun, Seongnam-si (KR)

(73) Assignees: SAMSUNG ELECTRONICS CO., LTD., Gyeonggi-do (KR); SAMSUNG DISPLAY CO., LTD., Gyeonggi-do (KR); SAMSUNG SDI CO., LTD., Gyeonggi-do (KR)

( * ) Notice: Subject to any disclaimer, the term of this patent is extended or adjusted under 35 U.S.C. 154(b) by 64 days.

This patent is subject to a terminal disclaimer.

(21) Appl. No.: 17/372,976

(22) Filed: Jul. 12, 2021

(65) Prior Publication Data

US 2021/0343807 A1 Nov. 4, 2021

Related U.S. Application Data

(63) Continuation of application No. 16/750,106, filed on Jan. 23, 2020, now Pat. No. 11,075,254.

(30) Foreign Application Priority Data

Jan. 24, 2019 (KR) ........................ 10-2019-0009438

(51) Int. Cl.
*H10K 59/122* (2023.01)
*H10K 50/115* (2023.01)
(Continued)

(52) U.S. Cl.
CPC ......... *H10K 59/122* (2023.02); *H10K 50/115* (2023.02); *H10K 50/854* (2023.02); *H10K 59/38* (2023.02)

(58) Field of Classification Search
CPC . H01L 27/3246; H01L 27/322; H01L 51/502; H01L 51/5268
See application file for complete search history.

(56) References Cited

U.S. PATENT DOCUMENTS 7,855,508 B2 12/2010 Cok et al.
8,446,346 B2 5/2013 Jeong et al.
(Continued)

FOREIGN PATENT DOCUMENTS

JP 2016006768 A 1/2016
KR 101107172 B1 1/2012
(Continued)

*Primary Examiner* — Fernando L Toledo
*Assistant Examiner* — Neil R Prasad
(74) *Attorney, Agent, or Firm* — Cantor Colburn LLP (57) ABSTRACT

A display device includes a first electrode, a pixel define layer disposed on the first electrode, the pixel define layer including an opening, an organic emission layer disposed on the pixel define layer, the organic emission layer in electrical communication with the first electrode through the opening, a second electrode disposed on the organic emission layer, a light recycle layer disposed on the second electrode, and a color filter layer disposed on the light recycle layer, the color filter layer including a quantum dot, wherein a width of the organic emission layer is longer than a width of the color filter layer.

20 Claims, 9 Drawing Sheets

(51) Int. Cl.
    *H10K 50/854*    (2023.01)
    *H10K 59/38*    (2023.01)

(56) References Cited

U.S. PATENT DOCUMENTS

| | | | |
|---|---|---|---|
| 8,921,840 | B2 | 12/2014 | Kim et al. |
| 9,184,403 | B2 | 11/2015 | Cho et al. |
| 11,075,254 | B2 * | 7/2021 | Chung ................ H01L 27/3246 |
| 2014/0191203 | A1 | 7/2014 | Son et al. |
| 2015/0228697 | A1 | 8/2015 | Liu et al. |
| 2015/0318506 | A1 | 11/2015 | Zhou et al. |
| 2015/0349285 | A1 | 12/2015 | Seo et al. |
| 2017/0141162 | A1 | 5/2017 | Kim et al. |
| 2017/0240728 | A1 * | 8/2017 | Lee .................. G02F 1/133617 |
| 2018/0182814 | A1 | 6/2018 | Kim et al. |
| 2018/0190740 | A1 * | 7/2018 | Bang .................. H01L 51/5234 |

FOREIGN PATENT DOCUMENTS

| | | |
|---|---|---|
| KR | 20140059372 A | 5/2014 |
| KR | 20140090911 A | 7/2014 |
| KR | 20150039066 A | 4/2015 |
| KR | 20160028817 A | 3/2016 |
| KR | 20170057041 A | 5/2017 |
| KR | 20170096583 A | 8/2017 |

\* cited by examiner

DISPLAY DEVICE

CROSS-REFERENCE TO RELATED APPLICATION

This application is a continuation application of application Ser. No. 16/750,106, filed Jul. 27, 2021, which claims priority to and the benefit of Korean Patent Application No. 10-2019-0009438 filed in the Korean Intellectual Property Office on Jan. 24, 2019, and all the benefits accruing therefrom under 35 U.S.C. § 119, the content of which in its entirety is herein incorporated by reference.

BACKGROUND

1. Field

A display device capable of displaying an image is disclosed.

2. Description of the Related Art

Display devices include, for example, liquid crystal displays ("LCDs"), a plasma display panels ("PDPs"), and an organic light emitting diode ("OLED") displays. Liquid crystal displays ("LCDs") and organic light emitting diode ("OLED") displays may be made in the form of a thin film, may exhibit, for example, low power and low exothermicity, and may be applied to, e.g., used in, various display devices such as mobile devices, computer monitors, and televisions ("TVs").

An organic light emitting diode ("OLED") display may be very thin and flexible compared with other display devices, and may be applied to, e.g., used in, flexible display devices such as a rollable, stretchable, or foldable device or a small portable electronic device such as, for example, a smart band or a smart watch.

It would be desirable to dispose, e.g., include, a color filter including quantum dots in order to improve color purity of an organic light emitting diode ("OLED") display. A quantum dot is a nanocrystal semiconductor material having a diameter of less than or equal to around 10 nanometers (nm), which shows, e.g., exhibits, quantum confinement effects. Quantum dots generate stronger light in a narrow wavelength region than phosphors, and thus are effective in improvement of color purity of emitted light.

Quantum dots emit light while excited electrons are transitioned from a conduction band to a valance band and wavelengths are changed depending upon a particle size even in the same material. As smaller quantum dots emit light of a shorter wavelength, light in a desirable wavelength region may be obtained by adjusting the sizes of the quantum dots.

SUMMARY

A display device having improved photo-efficiency and color purity is provided.

According to an embodiment, a display device includes a first electrode, a pixel define layer disposed on the first electrode, the pixel define layer include an opening, an organic emission layer disposed on the pixel define layer, the organic emission layer in electrical communication with the first electrode through the opening, a second electrode disposed on the organic emission layer, a light recycle layer disposed on the second electrode, and a color filter layer disposed on the light recycle layer, the color filter layer including a quantum dot, wherein a width of the organic emission layer is longer than a width of the color filter layer.

A side of the pixel define layer adjacent the opening may be slanted with respect to an upper surface of the pixel define layer, and the organic emission layer may be extend from the first electrode to a portion of the upper surface of the pixel define layer adjacent the slanted side of the pixel define layer. A width of the opening may be longer than or equal to a width of the color filter layer.

At least one portion of the color filter layer may be disposed in the opening.

The organic emission layer may emit a third light, and the light recycle layer may transmit the third light and may reflect a first light and a second light, each of which has a different wavelength than the third light.

The first light may be red light, the second light may be green light, and the third light may be blue light.

The light recycle layer may have a transmittance for the third light of about 90% to about 100%.

The light recycle layer may have a transmittance for each of the first light and the second light of about 0% to about 20%.

The light recycle layer may have a thickness of about 0.5 micrometers ($\mu m$) to about 5 $\mu m$.

The color filter layer may include a first color filter layer including a first quantum dot configured to convert the third light into the first light, and a second color filter layer including a second quantum dot configured to convert the third light into the second light.

The display device may further include a substrate, the first electrode being disposed on an upper surface of the substrate; and a transmissive layer adjacent to the first color filter layer, the second color filter layer, or a combination thereof in a direction parallel to the upper surface of the substrate. The transmissive layer and/or the color filter layer may include a light scatterer.

The display device may further include a light blocking member between each of the first color filter layer, the second color filter layer, and the transmissive layer in the direction parallel to the upper surface of the substrate.

The light recycle layer may be overlapped with the first color filter layer, the second color filter layer, or a combination thereof.

The second electrode and the light recycle layer may be in direct contact with each other, and at least one portion of an upper surface of the second electrode may include an undulating structure.

The second electrode and the light recycle layer may be in direct contact, at least one portion of an upper surface of the light recycle layer comprises an undulating structure, and at least one portion of a lower surface of the light recycle layer may include an undulating structure.

The display device may further include a third light blocking layer disposed on the color filter layer and overlapped with the first color filter layer, the second color filter layer, or a combination thereof.

The quantum dot may include a Group II-VI compound that does not include Cd, a Group III-V compound, a Group IV-VI compound, a Group IV element or compound, a Group compound, a Group I-II-IV-VI compound that does not include Cd, or a combination thereof.

The quantum dot may have a core-shell structure.

A display device with improved photo-efficiency and color purity may be provided.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Hereinafter, example embodiments of the present invention will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, examples of "Group II metal" may refer to a Group II metal, for example Zn, Cd, Hg, or Mg.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

Quantum dots may emit light in all directions, and it may be desirable to drive converted light through the quantum dots in a specific direction or to increase energy for driving converted light, in order to improve the photo-efficiency of a display device including the quantum dots. Therefore, even if a color filter including quantum dots is disposed on an OLED display, a method of securing both photo-efficiency and color purity is desirable.

Figure 1:
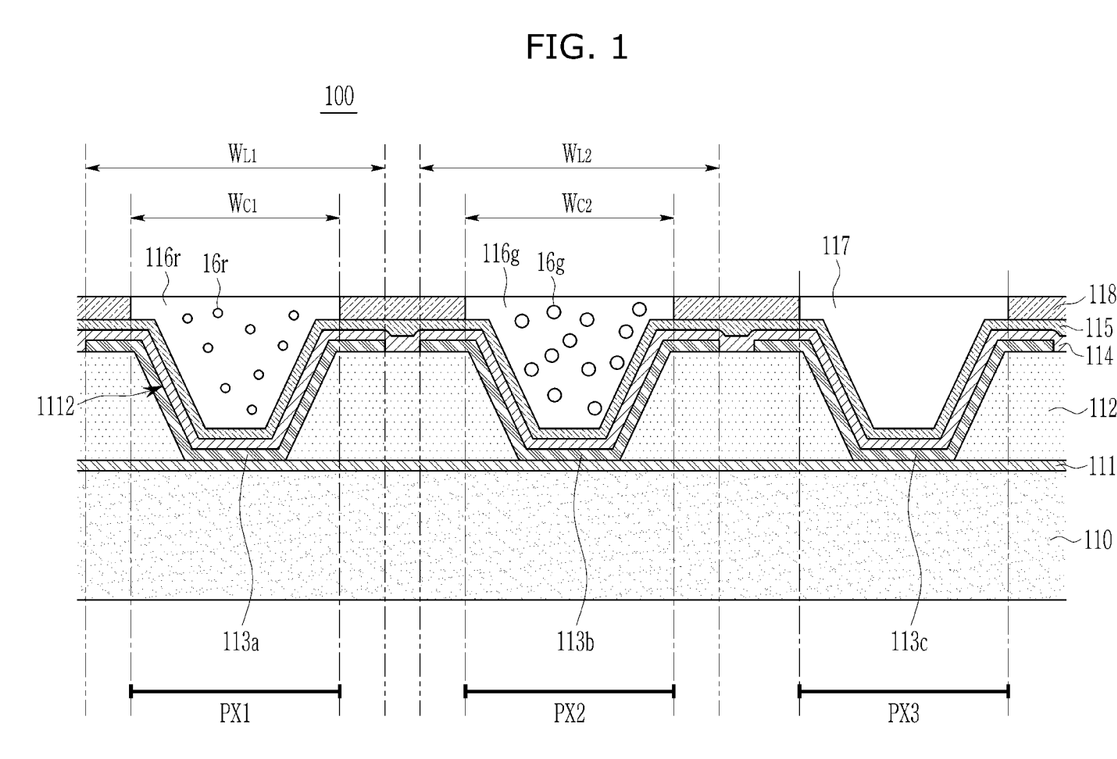
FIG. 1 is a cross-sectional view of an embodiment showing a display device.

FIG. 1 is a cross-sectional view showing a display device according to an embodiment.

Referring to FIG. 1, a display device 100 according to an embodiment has a structure in which a first electrode 111, a pixel define layer 112, an organic emission layer 113, a second electrode 114, a light recycle layer 115, and a color filter layer 116 including quantum dots 16 which are disposed in order on the structure substrate 110.

The substrate 110 may be a transparent insulating substrate and may be made of a material having flexibility. The substrate 110 may include glass or a polymer material in a film having a glass transition temperature (Tg) of greater than about 150° C. For example, the substrate may include a cycloolefin copolymer ("COC") or a cycloolefin polymer ("COP") based material.

A driving circuit may be disposed directly on the substrate 110. The driving circuit may be connected to the organic emission layer 113 which will be described later. The driving circuit may include, for example, a line such as, for example, a scan line, a data line, a driving power source line, a common power source line, or a combination thereof, at least two thin film transistors ("TFTs") connected to the wire and corresponding to one organic light emitting diode, and a capacitor. The driving circuit may have a variety of structures.

The first electrode 111 may be disposed on the substrate 110, for example, directly on the driving circuit. In an embodiment, the first electrode 111 may be directly connected to the driving circuit and may flow a current to the organic emission layer 113, e.g., may provide a path of electrical communication to the organic emission layer 113.

In an embodiment, the first electrode 111 may include, for example, silver, aluminum, chromium, molybdenum, tungsten, titanium, gold, palladium, or an alloy thereof and a metal oxide such as molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof. The first electrode 111 may have a monolayer structure or may have a multi-layer structure of two or more layers.

The first electrode 111 may include a material having light transmittance for light in an infrared or ultraviolet ("UV") wavelength region or a material having semi-permeable properties to selectively transmit only light in a specific wavelength region. The first electrode 111 may also function as a reflecting electrode to reflect light in a visible light wavelength region.

The pixel define layer 112 is disposed on the first electrode 111. The pixel define layer 112 may be formed of, for example, an organic material or an inorganic material. For example, the pixel define layer 112 may include a photoresist, organic material such as, for example, a polyacryl-based resin, a polyimide-based resin, or an acryl-based resin, or an inorganic material such as a silicon compound. As a non-limiting example, the pixel define layer 112 may be formed using a photoresist including a black pigment. In this case, the pixel define layer 112 may have a light-blocking function.

The pixel define layer 112 may include nano-structured scattering particles dispersed therein. The scattering particles may include inorganic particles or polymer particles. For example, inorganic particles such as, for example, silica, $TiO_2$, or $ZrO_2$, or polymer particles such as, for example, polystyrene or polymethylmethacrylate ("PMMA") may be included.

In an embodiment, the pixel define layer 112 includes an opening 1112 exposing a portion of the first electrode 111. The side of the pixel define layer 112 formed by the opening 1112 may have a slant structure, e.g., the side of the pixel define layer 112 adjacent the opening 1112 may be slanted with respect to an upper surface of the pixel define layer 112.

In an embodiment, the pixel define layer 112 may define a pixel area of the display device 100 through, e.g., in, the opening 1112. An area where the opening 1112 of the pixel defining layer 112 is disposed may be a pixel area where light is emitted and an area where the opening 1112 is not disposed may be a non-light emitting region in which light is blocked by a light blocking member that will be described later.

In an embodiment, the pixel area of the display device 100 may include a first pixel area PX1, a second pixel area PX2, and a third pixel area PX3. Each of the first pixel area PX1, the second pixel area PX2, and the third pixel area PX3 may emit light having different wavelength regions. That is, the first pixel area PX1 may emit a first light, the second pixel area PX2 may emit a second light, and the third pixel area PX3 may emit a third light, and the first light to third light may be light of different wavelength regions.

Each of the first light, the second light, and the third light may vary depending on types of light emitted from the organic emission layer 113, and types of the quantum dots 16 included in the color filter layer 116. The first light may be red light, the second light may be green light, and the third light may be blue light. In this case, the first light may belong to a wavelength region, e.g., have a wavelength in a range, of about 620 nm to about 680 nm, the second light may belong to a wavelength region, e.g., have a wavelength in a range, of about 510 nm to about 580 nm, and the third light may belong to a wavelength region, e.g., have a wavelength in a range, of about 380 nm to about 488 nm.

The first light to the third light may be various combinations of the red light, the green light, and the blue light, which may be white light, and may be for example magenta, yellow, and cyan colors, respectively.

In an embodiment, the organic emission layer 113 may cause electroluminescence of an organic light emitting material and thus emit light having a predetermined wavelength. The organic emission layer 113 may be disposed on the pixel define layer 112 and may electrically contact, e.g., be in electrical communication with, the first electrode 111 through the aforementioned opening 1112.

The organic emission layer 113 includes a first organic emission layer 113a disposed in a region corresponding to a first pixel area PX1, a second organic emission layer 113b disposed in a region corresponding to a second pixel area PX2, and a third organic emission layer 113c disposed in a region corresponding to a third pixel area PX3. The first to third organic emission layers 113a, 113b, and 113c respectively emit light in the same wavelength region, e.g., having the same wavelength, or having different wavelength regions.

In an embodiment, each of the first to third organic emission layers 113a, 113b, and 113c may emit a third light. When the first to third organic emission layers 113a, 113b, and 113c respectively emit the same light, the same organic light emitting material is used, which may be convenient in terms of a process, e.g., a process for forming a display device including the first to third organic emission layers 113a, 113b, and 113c. When a third light having higher, e.g., greater, energy than that of a first light or a second light is emitted, quantum dots converting the third light into the first light and/or the second light may be used as the quantum dots 16 which will be described later, and the third pixel area PX3 may not need a color filter layer disposed thereon and thus cost saving may be realized and a process for forming a display device may be simplified.

In an embodiment, the organic emission layer 113 may be extended, e.g., extend, to a portion of an upper surface of the pixel define layer 112 along the slant structure at the side of the pixel define layer 112, e.g., to a portion of an upper surface of the pixel define layer 112 adjacent the slanted side of the pixel define layer 112. Since the organic emission layer 113 is extended, e.g., extends, to the portion of the upper surface of the pixel define layer 112, the color filter layer 116 which will be described later may be completely overlapped with a region where the organic emission layer 113 is formed, e.g., a width of the organic emission layer 113 is longer than a width of the color filter layer 116, and in addition, when seen from the top of the display device 100, an area of the organic emission layer 113 may be larger than that of the color filter layer 116.

The organic emission layer 113 may include a light emitting part including the aforementioned organic light emitting material and various auxiliary layers for respectively supplying, transporting, and blocking electrons/holes to the light emitting part. The auxiliary layer may include an electron transport layer ("ETL"), a hole transport layer ("HTL"), an electron injection layer ("EIL"), a hole injection layer ("HIL"), an electron blocking layer, a hole blocking layer, or a combination thereof. Each of the auxiliary layers may be formed through any suitable formation method using any suitable materials. The second electrode 114 is disposed on the organic emission layer 113.

In an embodiment, the second electrode 114 is formed to cover the organic emission layer 113 and even the upper surface of the pixel define layer 112 not covered with the organic emission layer 113 but exposed and thus may be a common electrode.

In an embodiment, the second electrode 114 may serve as a light-transmitting electrode through which light emitted from the organic emission layer 113 is transmitted. In an embodiment, the second electrode 114 may include, for example, silver (Ag), aluminum (Al), copper (Cu), gold (Au), and an alloy thereof, or a metal oxide such as molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

The second electrode 114 may include a semi-permeable material selectively transmitting a light of a predetermined wavelength region, for example, the third light and for example, a light having a wavelength in a range of about 380 nm to about 488 nm.

The light recycle layer 115 may be disposed on the second electrode 114. The light recycle layer 115 may perform a function of transmitting at least the third light and reflecting the first and second lights having different wavelengths from the third light. The light recycle layer 115 may function as a band-pass filter ("BPF") selectively transmitting a light having a wavelength in a range corresponding to the third light. For example, the light recycle layer 115 may be a so-called short-wave pass filter ("SWPF") which selectively transmits a blue light having a relatively short wavelength region and blocks a light having a wavelength in a range beyond, e.g., having a wavelength outside the wavelength range for, the blue light, for example, a green light, a yellow light, or a red light.

The light recycle layer 115 is disposed directly on the second electrode 114 and directly contacts the second electrode 114 and thus may be formed to cover an entirety of the upper surfaces of the organic emission layer 113 and the second electrode 114.

In an embodiment, the light recycle layer 115 may be formed as one integrated layer covering an entirety of the first to third pixel areas PX1, PX2, and PX3 and each non-light emitting area among the pixel areas but is not necessarily limited thereto. For example, the light recycle layer 115 may be overlapped with at least the first pixel area PX1 and the second pixel area PX2 but not formed on the rest of the non-light emitting area, the third pixel area PX3, or a combination thereof.

Accordingly, while the third light emitted from the organic emission layer 113 passes through the light recycle layer 115 and is supplied to the color filter layer 116, the color filter layer 116 may reflect at least the first light (the first pixel area) and/or the second light (the second pixel area) and thus emit the first light and/or the second light out of the display device 100.

The display device 100 according to an embodiment recycles emits a part of light radiated in all directions from the quantum dots 16 by using the light recycle layer 115 and accordingly, may exhibit improved photo-efficiency, for example, with respect to the first light and/or the second light.

The light recycle layer 115 may include a plurality of layers having a different refractive index. The light recycle layer 115 may be formed for example by alternately laminating two layers having a different refractive index, for example, by alternately laminating a material having a high refractive index and a material having a low refractive index.

The layer having the high refractive index may include for example hafnium oxide, tantalum oxide, titanium oxide, zirconium oxide, magnesium oxide, cesium oxide, lanthanum oxide, indium oxide, niobium oxide, aluminum oxide, silicon nitride, or a combination thereof, and may include various materials having a higher refractive index than the layer having the low refractive index.

The layer having the low refractive index may include for example silicon oxide, and may include a variety of materials having a lower refractive index than the layer having the high refractive index.

As a refractive index difference between the layer having a high refractive index and the layer having a low refractive index is increased, the light recycle layer 115 having desirable light transmittance with respect to the third light and desirable light reflectance with respect to the first light or the second light may be formed.

In the light recycle layer 115, the thickness and the number layers of each of the layer having a high refractive index and the layer having a low refractive index may be determined depending on the refractive index and a reflection wavelength of each layer, and for example, in the light recycle layer 115, each layer having a high refractive index may have a thickness of about 3 nm to about 300 nm, and in the light recycle layer 115, each layer having a low refractive index may have a thickness of about 3 nm to about 300 nm. A total thickness of the light recycle layer 115 may be for example in a range of about 0.5 μm to about 5 μm. In the light recycle layer 115, the thicknesses and materials of each layer having a high refractive index and each layer having a low refractive index may be the same or different.

In an embodiment, the light recycle layer 115 may have a light transmittance for the third light of at least greater than or equal to about 90%, for example greater than or equal to about 91%, greater than or equal to about 92%, greater than or equal to about 93%, greater than or equal to about 94%, greater than or equal to about 95%, greater than or equal to about 96%, greater than or equal to about 97%, greater than or equal to about 98%, greater than or equal to about 99%, or about 100%.

In addition, the light recycle layer 115 may have a low light transmittance for light in the remaining visible light wavelength region except the third light, for example a light transmittance for the first light and the second light of less than or equal to about 20%, for example less than or equal to about 15%, less than or equal to about 10%, less than or equal to about 9%, less than or equal to about 8%, less than or equal to about 7%, less than or equal to about 6%, less than or equal to about 5%, less than or equal to about 4%, less than or equal to about 3%, less than or equal to about 2%, less than or equal to about 1%, or about 0%.

The color filter layer 116 is disposed on the light recycle layer 115 and includes the quantum dots 16 and thus performs a function of converting light supplied from the organic emission layer 113. In an embodiment, the color filter layer 116 may be formed by using a composition including a binder, a photopolymerizable monomer, a photoinitiator, and a solvent with the quantum dots 16.

In an embodiment, the color filter layer 116 may be disposed to correspond to pixel areas. For example, in an embodiment, the color filter layer 116 may be present only on the first pixel area PX1 and the second pixel area PX2.

In an embodiment, at least a part of the color filter layer 116 may be accommodated, e.g., disposed, in the opening 1112. As shown in FIG. 1, a lower part of the color filter layer 116 may be accommodated, e.g., disposed, in the opening 1112.

In an embodiment, the color filter layer 116 includes a first color filter layer 116r including first quantum dots 16r converting the third light into the first light and disposed on the first pixel area PX1 and a second color filter layer 116g including second quantum dots 16g converting the third light into the second light and disposed on the second pixel area PX2.

In an embodiment, the color filter layer 116 is formed to be completely overlapped with the aforementioned organic emission layer 113, e.g., a width of the aforementioned organic emission layer 113 is longer than a width of the color filter layer 116, but a width direction length, e.g., a width, of the organic emission layer 113 may be longer than that of the color filter layer 116. For example, referring to FIG. 1, width direction lengths, e.g., widths, $W_{L1}$ and $W_{L2}$ of the first and second organic emission layers 113a and 113b may be longer than width direction lengths, e.g., widths, $W_{c1}$ and $W_{c2}$ of the first and second color filter layers 116r and 116g.

When the organic emission layer 113 and the color filter layer 116 have this structural relationship, an area of the organic emission layer 113 may be larger than that of the color filter layer 116 with reference to a top view of the display device 100.

Accordingly, the third light emitted from the organic emission layer 113 may enter the light recycle layer 115, the color filter layer 116, or a combination thereof at an angle substantially perpendicular to the light recycle layer 115, the color filter layer 116, or a combination thereof (i.e., an incident angle of the third light with the light recycle layer 115, the color filter layer 116, or a combination thereof is about 0°). Accordingly, the display device 100 may show, e.g., exhibit, improved photo-efficiency, for example, with respect to the first light and/or the second light.

In an embodiment, the width of the organic emission layer 113 may be greater than about 1.00 times or greater than or equal to about 1.01 times wider than the width of the color filter layer 116. Within the range, the width of the organic emission layer 113 may be less than or equal to about 1.20 times, less than or equal to about 1.15 times, less than or equal to about 1.10 times, less than or equal to about 1.08 times, less than or equal to about 1.05 times, less than or equal to about 1.03 times wider than the width of the color filter layer 116.

For example, referring to FIG. 1, the widths, $W_{L1}$ and $W_{L2}$ of the first and second organic emission layers 113a and 113b may be greater than about 1.00 times or greater than or equal to about 1.01 times wider than the widths, $W_{c1}$ and $W_{c2}$ of the first and second color filter layers 116a and 116b. Within the range, the widths, $W_{L1}$ and $W_{L2}$ of the first and second organic emission layers 113a and 113b may be less than or equal to about 1.20 times, less than or equal to about 1.15 times, less than or equal to about 1.10 times, less than or equal to about 1.08 times, less than or equal to about 1.05 times, less than or equal to about 1.03 times wider than the widths, $W_{c1}$ and $W_{c2}$ of the first and second color filter layers 116a and 116b.

For example, the widths, $W_{L1}$ and $W_{L2}$ of the first and second organic emission layers 113a and 113b may be greater than about 1.00 times and less than or equal to about 1.20 times, greater than about 1.00 times and less than or equal to about 1.15 times, greater than about 1.00 times and less than or equal to about 1.10 times, greater than about 1.00 times and less than or equal to about 1.08 times, greater than about 1.00 times and less than or equal to about 1.05 times, greater than about 1.00 times and less than or equal to about 1.03 times wider than the widths, $W_{c1}$ and $W_{c2}$ of the first and second color filter layers 116a and 116b.

For example, the widths, $W_{L1}$ and $W_{L2}$ of the first and second organic emission layers 113a and 113b may be greater than or equal to about 1.01 times and less than or equal to about 1.20 times, greater than or equal to about 1.01 times and less than or equal to about 1.15 times, greater than or equal to about 1.01 times and less than or equal to about 1.10 times, greater than or equal to about 1.01 times and less than or equal to about 1.08 times, greater than or equal to about 1.01 times and less than or equal to about 1.05 times, greater than or equal to about 1.01 times and less than or equal to about 1.03 times wider than the widths, $W_{c1}$ and $W_{c2}$ of the first and second color filter layers 116a and 116b. By having the widths $W_{L1}$ and $W_{L2}$ of the first and second organic light emitting layers 113a and 113b in the range, the improved effect of the photo-efficiency may be obtained without a loss of the light-emitting area. In an embodiment, the width of the organic emission layer 113 may be about 80% or more of a total thickness of the organic emission layer 113, the second electrode 114, and the light recycle layer 115. For example, referring to FIG. 1, the widths, $W_{L1}$ and $W_{L2}$ of the first and second organic emission layers 113a and 113b may be about 80% or more of a total thickness of the first or second organic emission layers 113a or 113b, the second electrode 114, and the light recycle layer 115. Within the range, the widths, $W_{L1}$ and $W_{L2}$ of the first and second organic emission layers 113a and 113b may be about 80% to 200%, about 80% to 150%, about 80% to 120%, about 86% to 200%, about 86% to 150% or about 86% to 120% of a total thickness of the first or second organic emission layers 113a or 113b, the second electrode 114, and the light recycle layer 115. By having the widths Wu and $W_{L2}$ of the first and second organic light emitting layers 113a and 113b in the range, the third light emitted from the first and second organic light emitting layers 113a and 113b may enter the light recycle layer 115 and/or the color filter layer 116 at an angle substantially perpendicular to the light recycle layer 115 and/or the color filter layer 116 without a loss of the light-emitting area.

The structural relationship of the organic emission layer 113 with the color filter layer 116 and the photo-efficiency improvement effect thereby are described later referring to FIGS. 2 to 4.

The quantum dots 16 included in the color filter layer 116 have a discontinuous energy bandgap due to a quantum confinement effect and thus may convert incident light through the quantum dots 16 into light having a particular wavelength and radiate it. Accordingly, the converted light by using the quantum dots 16 may have desirable color reproducibility and color purity.

In an embodiment, materials of the quantum dots 16 are not particularly limited and commercially available quantum dots may be used. For example, each of the quantum dots 16 according to an embodiment may be for example a Group II-VI compound that does not include Cd, a Group III-V compound, a Group IV-VI compound, a Group IV element or compound, a Group compound, a Group I-II-IV-VI compound that does not include Cd, or a combination thereof.

The quantum dots 16 according to an embodiment may or may not include cadmium. When the quantum dots 16 are non-cadmium-based quantum dot, the quantum dots 16 have minimal or no toxicity compared with a cadmium-based quantum dots and thus are less dangerous and more environmentally-friendly than cadmium-based quantum dots.

The Group II-VI compound may be a binary element compound such as ZnS, ZnSe, ZnTe, ZnO, HgS, HgSe, HgTe, MgSe, MgS, or a combination thereof; a ternary element compound such as ZnSeS, ZnSeTe, ZnSTe, HgSeS, HgSeTe, HgSTe, HgZnS, HgZnSe, HgZnTe, MgZnSe, MgZnS, or a combination thereof; a quaternary element compound such as HgZnTeS, HgZnSeS, HgZnSeTe, HgZnSTe, or a combination thereof; or a combination thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group III-V compound may further include a Group II metal (InZnP).

The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof. Examples of the Group compound may be $CuInSe_2$, $CuInS_2$, CuInGaSe, and CuInGaS, are not limited thereto. Examples of the Group I-II-IV-VI compound may be CuZnSnSe and CuZnSnS, are not limited thereto. Examples of the Group IV compound may be a single substance such as Si, Ge, or a combination thereof; a binary element compound such as SiC, SiGe, or a combination thereof; or a combination.

The binary element compound, the ternary element compound, or the quaternary element compound respectively exists in a uniform concentration in the particle or in partially different concentrations, e.g., concentration gradients, in the same particle.

According to an embodiment, the quantum dots 16 may have a core-shell structure including one semiconductor nanocrystal core and another semiconductor nanocrystal shell surrounding the core. The core and the shell may have a concentration gradient wherein the concentration of the element(s) of the shell decreases in a direction from the shell toward the core. In addition, the quantum dots 16 may have a structure including one semiconductor nanocrystal core and multi-shells surrounding the core. Herein, the multi-layered shell structure has a structure of two or more shells and each layer may have a single composition or an alloy or may have a concentration gradient.

When the quantum dots 16 have a core-shell structure, a material composition of the shell may have larger, e.g., higher, bandgap energy than that of the core, which may exhibit an effective quantum confinement effect. In the multi-layered shell, a shell that is outside of the core may have a higher, e.g., larger, bandgap energy than a shell that is near, e.g., closer, to the core and quantum dots may emit light having a wavelength in ultraviolet ("UV") to infrared ranges.

The quantum dots 16 may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or 100%.

In addition, in the display device 100, the quantum dots 16 may have a relatively narrow spectrum so as to improve color purity or color reproducibility. The quantum dots 16 may have for example a full width at half maximum ("FWHM") of a photoluminescence wavelength spectrum of less than or equal to about 45 nm, less than or equal to about 40 nm, or less than or equal to or about 30 nm, and greater than or equal to about 1 nm, greater than or equal to about 2 nm, or greater than or equal to or about 3 nm. Within the ranges, color purity or color reproducibility of a display device 100 may be improved.

The quantum dots 16 may have a particle diameter (the longest diameter for a non-spherically shaped particle) of about 1 nm to about 100 nm. For example, the quantum dots 16 may have a particle diameter of about 1 nm to about 20 nm, for example, about 2 nm (or about 3 nm) to about 15 nm.

In addition, the shapes of the quantum dots 16 may not be particularly limited. For example, the quantum dots 16 may have a spherical shape, an oval shape, a tetrahedral shape, a pyramidal shape, a cuboctahedral shape, a cylindrical shape, a polyhedral shape, a multi-armed shape, or may be in the shape of cubic nanoparticle, a nanotube, a nanowire, a nanofiber, a nanosheet, or a combination thereof. The quantum dots 16 may have any suitable cross-sectional shape.

The quantum dots 16 may be commercially available or may be synthesized in any suitable method. For example, several nano-sized quantum dots 16 may be synthesized according to a wet chemical process. In the wet chemical process, precursor materials react in an organic solvent to grow crystal particles. Herein, organic solvents or ligand-forming materials are naturally coordinated with, e.g., bound to, the surface of the quantum dots 16 to control a crystal growth.

An amount of the organic material coordinated on, e.g., to, the surface of the quantum dots 16 may be less than or equal to about 50 weight percent (wt %), for example, less than or equal to about 30 wt %, less than or equal to about 20 wt %, or less than or equal to about 10 wt %, based on a total weight of the quantum dots, and greater than or equal to about 0.001 wt %, for example, greater than or equal to about 0.01 wt %, or greater than or equal to about 0.1 wt %, based on a total weight of the quantum dots. This organic material may include a ligand bound on, e.g., to, the surface of the quantum dots 16, a residual organic solvent, or a combination thereof.

In an embodiment, the color filter layer 116 may include a predetermined amount of the quantum dots 16 to show excellent, e.g., exhibit desirable, luminous efficiency.

For example, the quantum dots 16 may be included for example in an amount of greater than or equal to about 5 wt %, greater than or equal to about 10 wt %, greater than or equal to about 15 wt %, or greater than or equal to about 20 wt %, and for example less than or equal to about 98 wt %, less than or equal to about 95 wt %, less than or equal to about 90 wt %, less than or equal to about 85 wt %, less than or equal to about 80 wt %, less than or equal to about 75 wt %, less than or equal to about 70 wt %, less than or equal to about 65 wt %, less than or equal to about 60 wt %, less than or equal to about 55 wt %, or less than or equal to about 50 wt %, or for example in a range of about 5 wt % to about 98 wt %, about 20 wt % to about 98 wt %, about 20 wt % to about 90 wt %, about 20 wt % to about 85 wt %, or about 50 wt % to about 85 wt %, based on a total weight of the color filter layer 116.

The specific amount of the quantum dots 16 may be changed depending on, for example, a material of the used quantum dots 16, a type of emitted light, or a material or a thickness of the light recycle layer 115.

The first and second color filter layers 116r and 116g according to an embodiment respectively may further include a light scatterer in order to improve emission efficiency of the first or second lights and front/side luminance uniformity. The light scatterer may include any suitable material evenly scattering light without a particular limit, for example, silica ($SiO_2$), hollow silica ($SiO_2$ having a hollow structure), $TiO_2$, $ZrO_2$, $Al_2O_3$, $In_2O_3$, ZnO, $SnO_2$, $Sb_2O_3$, ITO, or a combination thereof.

In an embodiment, the display device 100 may further include a transmissive layer 117 neighboring, e.g., adjacent to, the first color filter layer 116r, the second color filter layer 116g, or a combination thereof in a parallel direction to the upper surface of the substrate 110. Stated otherwise, the display device 100 may further include a substrate 110, the first electrode may be disposed on an upper surface of the substrate 110, and the display device 100 may further include a transmissive layer 117 adjacent to the first color filter layer 116r, the second color filter layer 116g, or a combination thereof in a direction parallel to the upper surface of the substrate. The transmissive layer 117 may fill the third pixel area PX3. The transmissive layer 117 may be formed of a transparent polymer and transmit the third light emitted from the third organic emission layer 113c, so that the third pixel area PX3 may emit the third light.

The transmissive layer 117 includes a material capable of transmitting the incident third light without a particular phosphor, quantum dot, or a combination thereof. For example, the transmissive layer 117 may include a polymer including, for example, a photosensitive resin.

The transmissive layer 117 according to an embodiment may further include a light scatterer to improve emission efficiency of the third light and front/side luminance uniformity. Examples of the light scatter may be the same as included in the aforementioned first and second color filter layers 116r and 116g and thus will not be described in detail.

The display device 100 according to an embodiment may further include a light blocking member 118 disposed in each gap among the first color filter layer 116r, the second color filter layer 116g, and the transmissive layer 117. The light blocking member 118 may be formed of a material not transmitting light, for example, metal particles such as, for example, chromium (Cr), silver (Ag), molybdenum (Mo), nickel (Ni), titanium (Ti), or tantalum (Ta), oxides of the metal particles, or a combination thereof. The light blocking member 118 may minimize or prevent color mixing, light leakage, or a combination thereof in the display device 100 and thus improve a contrast of the display device 100.

Hereinafter, referring to FIGS. 2 to 4, the structural relationship of the organic emission layer 113 with the color filter layer 116 according to an embodiment and a photo-efficiency improvement effect thereby are described.

Figure 2:
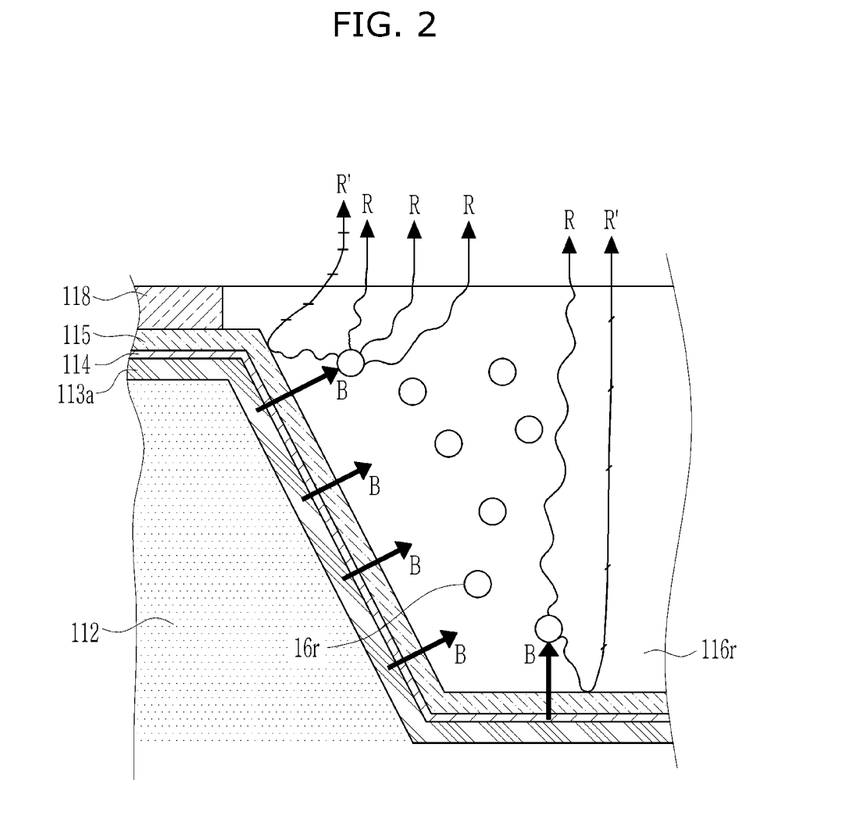
FIG. 2 is a schematic diagram of an embodiment schematically illustrating a light conversion process of a color filter layer in one pixel of a display device.
Figure 3:
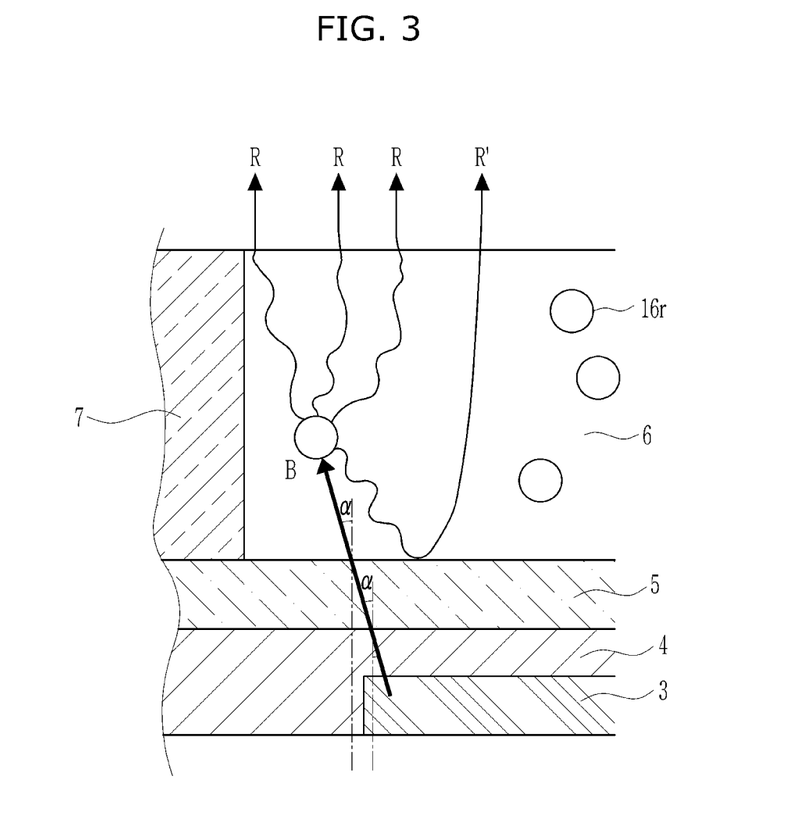
FIG. 3 is a schematic diagram schematically illustrating a light conversion process of a color filter layer.
Figure 4:
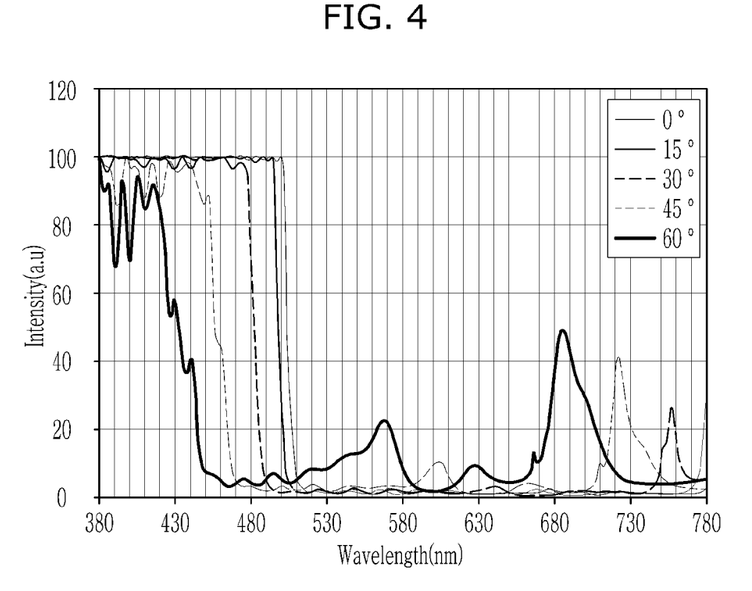
FIG. 4 is a graph of intensity (arbitrary units (a.u)) versus wavelength (nanometers (nm)) showing light transmittance changes of the light recycle layer depending on a wavelength according to viewing angle changes.

FIG. 2 is a schematic diagram schematically illustrating a light conversion process of a color filter layer in one pixel of a display device according to an embodiment, FIG. 3 is a schematic diagram schematically illustrating a light conversion process of a color filter layer when characteristics of the display device according to an embodiment are not satisfied, and FIG. 4 is a graph showing light transmittance changes of the light recycle layer depending on a wavelength according to viewing angle changes.

FIGS. 2 and 3 show the first pixel area PX1 as an example, which is adopted for convenient explanation, but the structural relationship and the effect thereby which will be described later may be equally applied to the second pixel area PX2.

FIG. 4 shows light transmittance depending on a wavelength of a light recycle layer at each viewing angle of 0°, 15°, 30°, 45°, and 60° with reference to a viewing angle of an incident light into the light recycle layer.

First, referring to FIG. 2, in the display device 100 according to an embodiment, blue lights (B of FIG. 2) emitted from the first organic emission layer 113a may pass the second electrode 114 and sequentially, enter the light recycle layer 115 and the first color filter layer 116r.

The incident lights enter the first quantum dots 16r, and the first quantum dots 16r convert the blue lights (B) into red lights and thus radiate the red lights into all directions. Herein, the red lights radiated into all light-emitting directions of the display device 100 are emitted out of the display device 100 (R of FIG. 2), and herein, the red lights radiated into a direction of the light recycle layer 115 are reflected (recycled) on the interface of the light recycle layer 115 and then, emitted out of the display device 100 (R' of FIG. 2).

In addition, referring to FIG. 2, the blue lights (B) respectively entering the light recycle layer 115 and the first color filter layer 116r may enter at an angle substantially perpendicular to the light recycle layer 115 and the first color filter layer 116*r* (at an incident angle of about 0°).

In the display device according to an embodiment, the blue lights (B) may enter the light recycle layer 115 and the first color filter layer 116*r* at an angle substantially perpendicular to the interfaces of the light recycle layer 115 and the first color filter layer 116*r* in the first pixel area PX1.

FIG. 3 shows that unlike the display device 100 according to an embodiment, a first color filter layer 6 is not completely overlapped with a first organic emission layer 3 but is extended to be longer, e.g., extends farther, than a first organic emission layer 3.

Herein, a blue light (B of FIG. 3) emitted from the end of the first organic emission layer 3 toward the end of the first color filter layer 6 not overlapped with the first organic emission layer 3 enters a second electrode 4, a light recycle layer 5, and the first color filter layer 6 respectively at an angle of a ° (0<α<90°). The incident angle may be variable depending on a width of an area where the end of the first organic emission layer 3 is not overlapped with the light recycle layer 5.

Referring to FIG. 4, light transmittance of the light recycle layer may change depending on an incident angle, and for example, light transmittance about, e.g., of, light of a short wavelength such as, for example, blue light may change.

For example, when the incident angle is about 0°, as shown in FIG. 2, the light recycle layer 115 may exhibit light transmittance of greater than or equal to about 90%, for example greater than or equal to about 90%, greater than or equal to about 91%, greater than or equal to about 92%, greater than or equal to about 93%, greater than or equal to about 94%, greater than or equal to about 95%, greater than or equal to about 96%, greater than or equal to about 97%, greater than or equal to about 98%, greater than or equal to about 99%, or about 100% over the entire blue light wavelength region, as shown in FIG. 4. Accordingly, the display device according to an embodiment has a structure shown in FIG. 2 and may function as an excellent blue light transmittance filter.

As shown in FIG. 3, in a display device having an incident angle of α°, as the a ° gradually increases to 15°, 30°, 45°, and 60°, a light transmittance curve of the light recycle layer 5 is gradually shifted toward the left, and the display device may exhibit non-uniform light transmittance in a blue light wavelength region and deteriorated light transmittance in some wavelength regions.

In addition, as the incident angle gradually increases, light transmittance of the light recycle layer about, e.g., of, a long wavelength region such as green and red light wavelength regions unintentionally increases. While not wanting to be bound by theory, it is understood that the increase is caused by the left shift of the light transmittance curve according to, e.g., with, the incident angle increase.

Accordingly, as an incident angle of a third light entering the light recycle layer 5 gradually increases, blue light transmittance may not only be gradually deteriorated, but also light transmittance about, e.g., of, light having a longer long wavelength than that of the blue light may unintentionally increase. Accordingly, when the incident angle into the light recycle layer is not adjusted into an appropriate level, the light recycle layer may not only not perform a desired function but also deteriorate light efficiency of the display device.

Accordingly, when an area of the organic emission layer 113 per each pixel is formed to be larger than that of the color filter layer 116, as shown in the display device 100 according to an embodiment, blue lights may enter the light recycle layer 115 and the color filter layer 116 at an angle substantially perpendicular to all the interfaces of the light recycle layer 115 and the color filter layer 116 in each pixel area. Accordingly, photo-efficiency, for example, in the first pixel area PX1 and the second pixel area PX2 where the color filter layer 116 is disposed may be improved.

Hereinafter, referring to FIGS. 5 to 9, various exemplary variations of the display device according to an embodiment are illustrated.

FIGS. 5 to 8 are cross-sectional views showing various exemplary variations applying, e.g., including, a concavo-convex, e.g., undulating, structure to the second electrode the light recycle layer, or a combination thereof of the display device according to an embodiment.

Referring to FIGS. 5 to 8, the second electrodes, light recycle layers, or a combination thereof according to exemplary variations may have a concavo-convex, e.g., undulating, structure.

Figure 5:
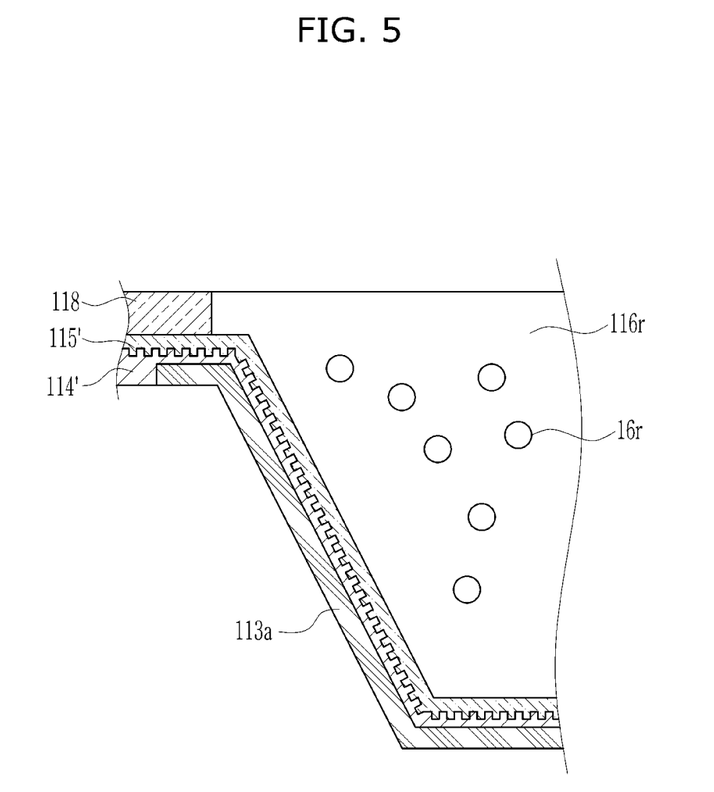
FIGS. 5 to 8 are cross-sectional views of embodiments in which a concavo-convex, e.g., undulating, structure is applied to, e.g., used for, a second electrode, a light recycle layer, or a combination thereof of the display device.
Figure 6:
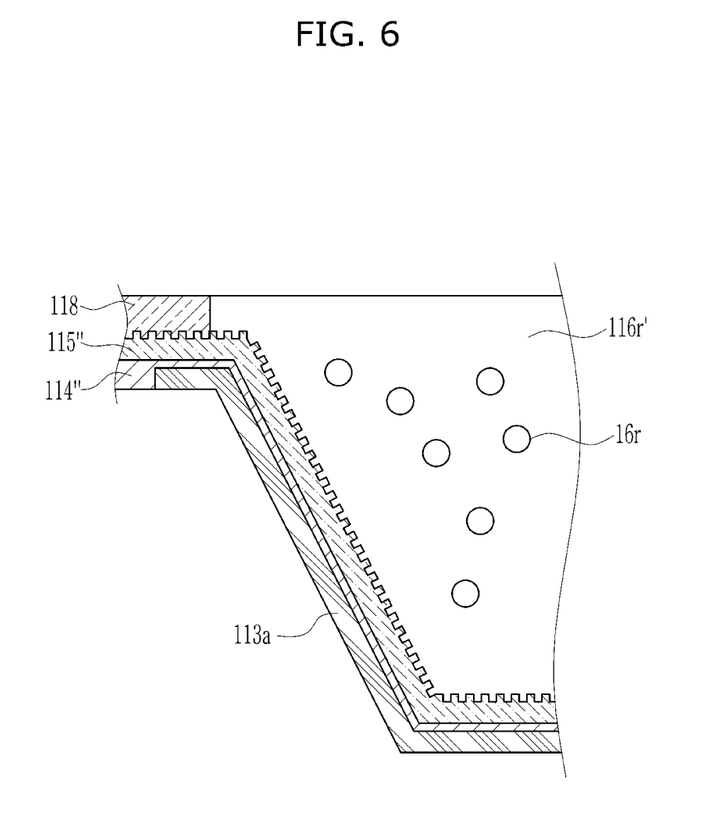
Figure 7:
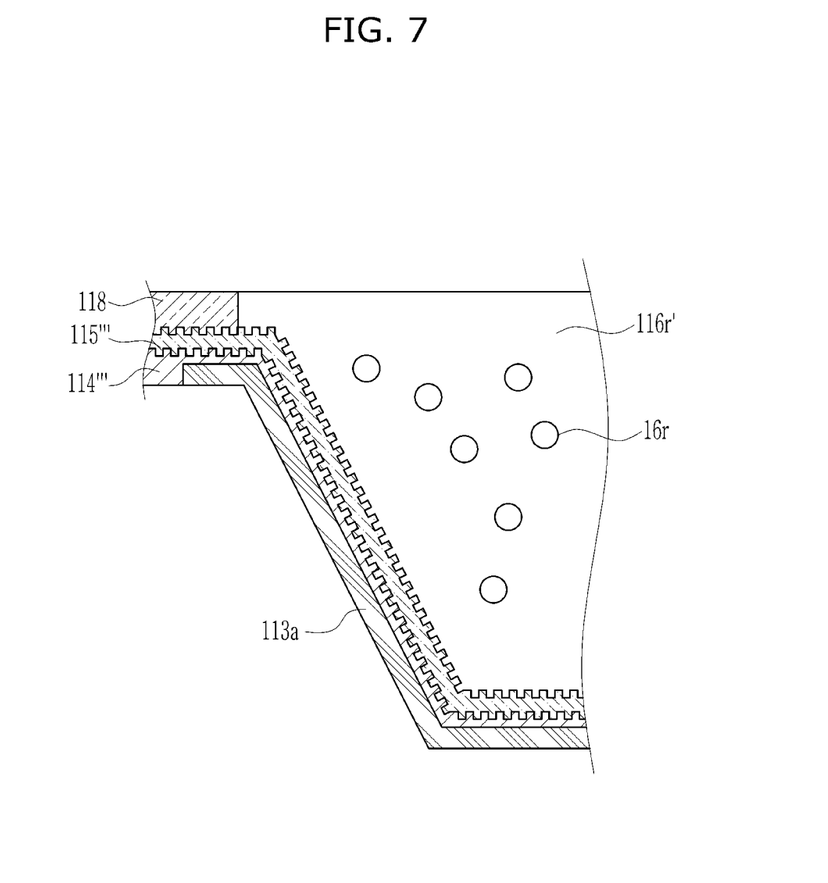

For example, as shown in FIG. 5, the entire upper surface of a second electrode 114' may have a concavo-convex, e.g., undulating, structure, and as shown in FIG. 6, the entire upper surface of a light recycle layer 115" may have a concavo-convex, e.g., undulating, structure, and as shown in FIG. 7, the entire upper surface of a second electrode 114" and the entire upper/lower surfaces of a light recycle layer 115''' may have a concavo-convex, e.g., undulating, structure.

Figure 8:
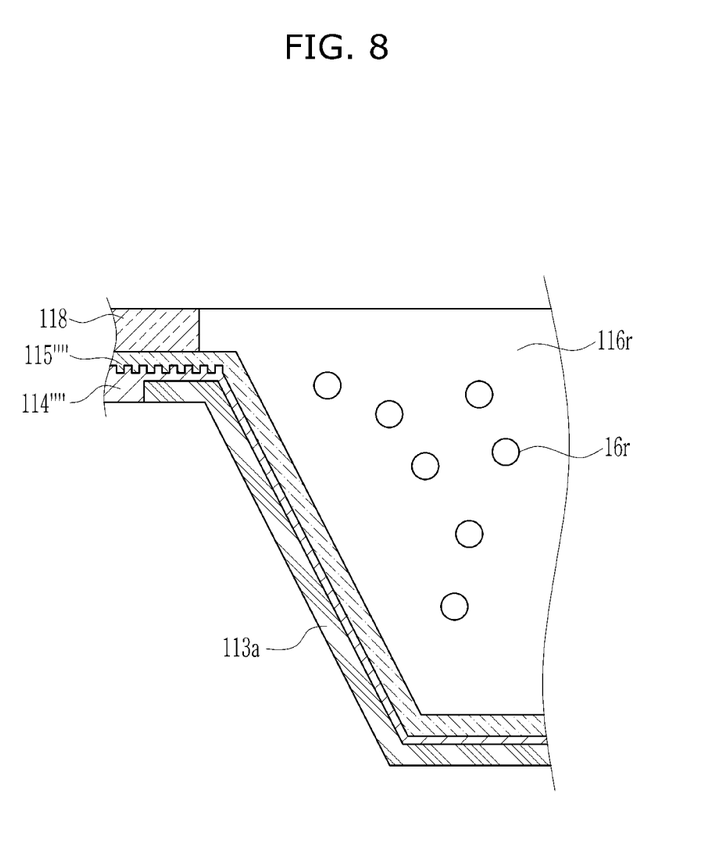

The concavo-convex, e.g., undulating, structure may not be formed all over, e.g., on an entirety of, the second electrodes, light recycle layers, or a combination thereof. For example, as shown in FIG. 8, the upper surface of a second electrode 114''' overlapped with the upper surface of a pixel define layer and a part of the lower surface of a light recycle layer 115'''' may have a concavo-convex, e.g., undulating, structure.

In this way, when the concavo-convex, e.g., undulating, structure is applied to the surfaces of the second electrodes, the light recycle layers, or a combination thereof, a perpendicular incident ratio of the third light to the light recycle layers and the color filter layers may be further improved, and photo-efficiency of a display device may be further improved.

Figure 9:
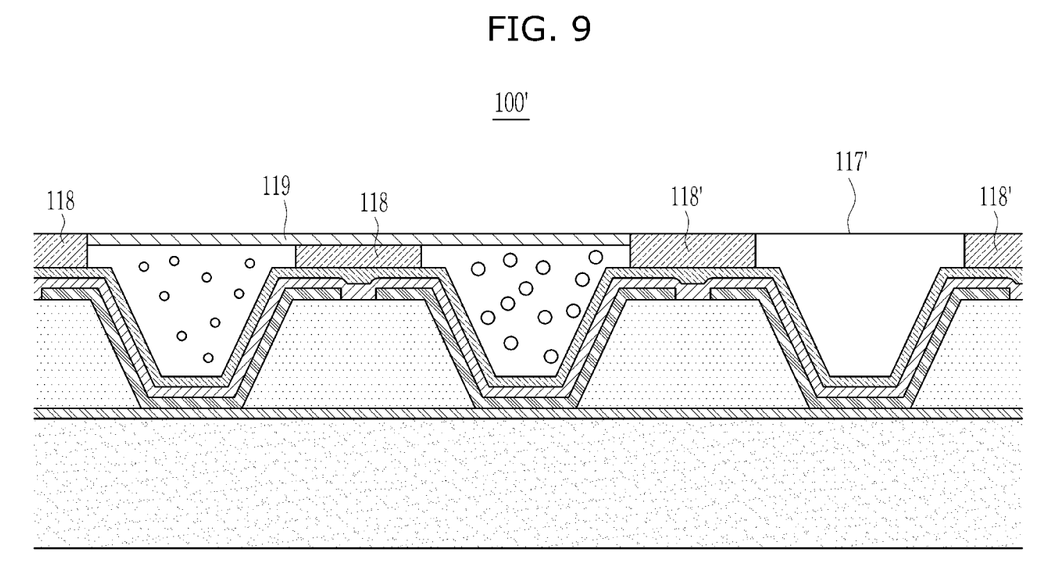
FIG. 9 is a cross-sectional view of an embodiment showing a display device further including a third light blocking layer.

FIG. 9 is a cross-sectional view showing a display device further including a third light blocking layer according to an exemplary variation.

Referring to FIG. 9, the display device 100' according to an exemplary variation may further include a third light blocking layer 119 disposed on the color filter layer 116 and overlapped with the first color filter layer 116*r*, the second color filter layer 116*g*, or a combination thereof.

The third light blocking layer 119 may be formed of a material transmitting the first and second lights having a relatively longer wavelength and reflecting or absorbing the third light having a relatively shorter wavelength. The third light blocking layer 119 may be a long-wavelength pass filter ("LWPF") and thus perform an opposite function to the aforementioned light recycle layer 115.

Like the aforementioned light recycle layer 115, the third light blocking layer 119 also may include a plurality of layers having a different refractive index. The third light blocking layer 119 may be formed for example by alternately laminating two layers having a different refractive index, for example, alternately laminating a material having a high refractive index and another material having a low refractive index.

The material having a high refractive index, the material having a low refractive index, and each a thickness of each of the materials may be the same as those of the aforementioned light recycle layer 115, and the third light blocking layer 119 may be formed to function as the aforementioned long wavelength pass filter.

In an embodiment, the third light blocking layer 119 may be extended, e.g., may extend, as one integrated layer from the first pixel area PX1 to the second pixel area PX2. The disposition of the third light blocking layer 119 may be variously modified under a condition of at least covering the first color filter layer 116r and the second color filter layer 116g.

In this way, when two optical filters of the light recycle layer 115 and the third light blocking layer 119 are used to control lights emitted from the first and second pixel areas PX1 and PX2, the display device 100' may have excellent photo-efficiency, e.g., exhibit desirable photo-efficiency, and emit light having high color purity.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A display device comprising
a first electrode,
a pixel define layer disposed on the first electrode, the pixel define layer comprising an opening exposing a portion of the first electrode,
a light emission layer disposed in the opening, the light emission layer in electrical communication with the first electrode through the opening,
a second electrode disposed on the light emission layer,
a light recycle layer disposed on a side of the opening of the pixel define layer, and
a color filter layer disposed on the second electrode, the color filter layer comprising a quantum dot,
wherein the light recycle layer reflects a first light and transmits a third light, and the first light has a different wavelength than the third light.

2. The display device of claim 1, wherein the color filter layer is disposed directly on the second electrode and directly contacts the second electrode.

3. The display device of claim 1, wherein the color filter layer is overlapped with the light emission layer.

4. The display device of claim 1, wherein a width of the opening is longer than or equal to the width of the color filter layer.

5. The display device of claim 1, wherein at least one portion of the color filter layer is disposed in the opening.

6. The display device of claim 1, wherein
the light emission layer emits the third light,
the light recycle layer reflects a second light, and the second light has a wavelength which is different than a wavelength of the third light.

7. The display device of claim 6, wherein the first light is red light, the second light is green light, and the third light is blue light.

8. The display device of claim 1, wherein
the pixel define layer comprises a plurality of the openings,
the display device comprises a first pixel area, a second pixel area, and a third pixel area where a plurality of the openings is disposed, and
the first pixel area emits a first light, the second pixel area emits a second light, and the third pixel area emits a third light, and the first light to third light are light of different wavelength regions.

9. The display device of claim 1, wherein the side of the opening of the pixel define layer is slanted with respect to an upper surface of the pixel define layer, and
the light recycle layer is disposed on the slanted side of the opening.

10. The display device of claim 8, wherein the light recycle layer is overlapped with at least the first pixel area and the second pixel area but not formed on the rest of the pixel defining layer, the third pixel area, or a combination thereof.

11. The display device of claim 1, wherein the light recycle layer comprises a plurality of layers having a different refractive index, and each layer having a different refractive index has a thickness of about 3 nanometers to about 300 nanometers.

12. The display device of claim 1, wherein the light recycle layer has a thickness of about 0.5 micrometers to about 5 micrometers.

13. The display device of claim 1, wherein
the color filter layer comprises
a first color filter layer comprising a first quantum dot configured to convert the third light into the first light, and
a second color filter layer comprising a second quantum dot configured to convert the third light into the second light.

14. The display device of claim 13, further comprising
a substrate, the first electrode being disposed on an upper surface of the substrate; and
a transmissive layer adjacent to the first color filter layer, the second color filter layer, or a combination thereof in a direction parallel to the upper surface of the substrate.

15. The display device of claim 14, wherein the transmissive layer comprises a light scatterer.

16. The display device of claim 14, further comprising a light blocking member between each of the first color filter layer, the second color filter layer, and the transmissive layer in the direction parallel to the upper surface of the substrate.

17. The display device of claim 13, wherein
the second electrode and the light recycle layer are in direct contact with each other, and
at least one portion of an upper surface of the second electrode comprises an undulating structure.

18. The display device of claim 13, wherein
the second electrode and the light recycle layer are in direct contact with each other,
at least one portion of an upper surface of the light recycle layer comprises an undulating structure, and
at least one portion of a lower surface of the light recycle layer comprises an undulating structure.

19. The display device of claim 13, further comprising a third light blocking layer disposed on the color filter layer and overlapped with the first color filter layer, the second color filter layer, or a combination thereof.

20. The display device of claim 1, wherein a width of the light emission layer is longer than a width of the color filter layer.

* * * * *